US006900163B2

(12) United States Patent
Khatri

(10) Patent No.: US 6,900,163 B2
(45) Date of Patent: *May 31, 2005

(54) DRY THERMAL INTERFACE MATERIAL

(75) Inventor: Prakash Khatri, Matawan, NJ (US)

(73) Assignee: AOS Thermal Compounds, Eatontown, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/612,042

(22) Filed: Jul. 3, 2003

(65) Prior Publication Data

US 2004/0018945 A1 Jan. 29, 2004

Related U.S. Application Data

(63) Continuation of application No. 09/951,501, filed on Sep. 14, 2001, now Pat. No. 6,610,635, which is a continuation-in-part of application No. 09/661,729, filed on Sep. 14, 2000, now Pat. No. 6,475,962.

(51) Int. Cl.[7] .................. C10M 113/08; C10M 169/02; H05K 7/20
(52) U.S. Cl. ....................... 508/155; 508/161; 508/172; 508/485; 508/591; 361/704
(58) Field of Search ........................................ 508/155

(56) References Cited

U.S. PATENT DOCUMENTS

| | | | |
|---|---|---|---|
| 3,669,884 A | 6/1972 | Wright ......................... | 252/36 |
| 4,738,737 A | 4/1988 | Runde et al. ................. | 156/91 |
| 4,803,100 A | 2/1989 | Ameen et al. ............... | 427/387 |
| 5,167,851 A | 12/1992 | Jamison et al. ............... | 252/74 |
| 5,194,480 A | 3/1993 | Block et al. | |
| 5,250,209 A | 10/1993 | Jamison et al. ............... | 252/74 |
| 5,298,791 A | 3/1994 | Liberty et al. ............... | 257/707 |
| 5,904,796 A | 5/1999 | Freuler et al. ............... | 156/278 |
| 6,049,458 A | 4/2000 | Lee et al. .................... | 361/705 |
| 6,054,198 A | 4/2000 | Bunyan et al. ............. | 428/40.5 |
| 6,059,116 A | 5/2000 | Hinshaw et al. ............. | 206/714 |
| 6,114,429 A | 9/2000 | Yamada et al. ............. | 524/432 |
| 6,143,076 A | 11/2000 | Rasmussen et al. ........ | 118/411 |
| 6,174,841 B1 | 1/2001 | Yamada et al. ............. | 508/172 |
| 6,255,257 B1 | 7/2001 | Yamada et al. ............. | 508/172 |
| 6,286,212 B1 | 9/2001 | Eaton ....................... | 29/890.03 |
| 6,475,962 B1 | 11/2002 | Khatri ........................ | 508/161 |
| 6,610,635 B2 * | 8/2003 | Khatri ........................ | 508/161 |

FOREIGN PATENT DOCUMENTS

| | | |
|---|---|---|
| EP | 0906945 | 4/1999 |
| WO | WO/00/36893 | 6/2000 |

OTHER PUBLICATIONS

Advanced Thermal Interface Material: 'Dry–To–The–Touch' Thermal Grease by Khatri and Ziemski, Mar., 2001.
"Sprayable Thermal Grease Dramatically Reduces Labor While Offering Other Unique Advantages" by Khatri and Ziemski, 1999.

Article entitled, "Thermal Isolators", *PCIM*, Apr. 1999 (pp. 57–61).
Chomerics Technical Bulletin 69, "CHO–TERM T500", 10/99 (2pgs).
Power Devices, Inc. "Powerstrate" Advertisement (1 pg.), date unknown.
Article entitled, "Differential Phase Change Thermal Interface Materials", Technological Horizons (2 pgs.), date unknown.
Article entitled "Thermal Gap Fillers," *PCIM*, Sep. 1999 (pp. 24–25, 27).
Article entitled "Navigating the Maze of Thermal Interface Materials," Electrionic Product Supplement, (http://www.electronicsproducts.com) Fall, 1999 (5 pp.).
Article entitled "Thermal Resistance of Interface Materials as a Function of Pressure," Latham, (2 pp.), (http://www.electronics–cooling.com/Resources/EC Articles /SEP96/sep96_tb.htm).
Wakefield Engineering advertisement Thermal Compounds, Adhesives, Interface Materials, Hardware, Installation Tools (1 pg.), believed dated 1997 or before.
Bergquist Company Brochure "Sil–Pad Design Guide" 1997–1998 (1 pg.).
Chomerics Company (Division of Parker–Hannifin) Advertisement, (1 pg.), from *Electronics Cooling*, vol. 7, No. 1, Feb. 2001.
Fujipoly Company advertisement from *PCIM*, Jan. 2000, p. 14.
MHW brochure regarding Keratherm® (2 pp.), Feb. 1999.
MHW International Corp. advertisement from *Electronics Cooling*, vol. 7, No. 1, Feb. 2001, p. 13.
W.L. Gore & Assoc. advertisement (1 pg.) from *Electronic Packaging and Production*, Jun. 2001.
Emerson & Cuming (division of National Starch and Chemical Company), advertisement (1 pg.).

(Continued)

*Primary Examiner*—Ellen M. McAvoy
(74) *Attorney, Agent, or Firm*—Staas & Halsey LLP

(57) ABSTRACT

A thermal interface material including a compound which has high thermal conductivity, is dry-to-the-touch, but naturally tacky, and may be formed into various shapes, such as sheets and blocks, to serve as a heat transfer material for electronic components. The compound includes a pre-blend of a polyol ester and an antioxidant, a boron nitride filler, a high viscosity oil, and either a solvent, a surfactant, and a polystyrene-based polymer, or aluminum silicate. A method for using the compound includes the steps of providing a heat generating electronic component with a first surface; providing a heat dissipating component with a second surface with which the first surface is to interface; and disposing the compound between the respective surfaces to effectuate efficient heat transfer therebetween. Further, a removable liner can be applied to an exposed surface of the compound.

20 Claims, No Drawings

OTHER PUBLICATIONS

Honeywell advertisement (1 pg.) from *Electronics Cooling*, vol. 7, No. 1, Feb. 2001.

"Electrolube's Unique Heat Transfer Compound Aerosol Optimises Board Thermal Performance," Jul. 28, 2000 website pages (5 pp.).

AOS brochure describing thermal greases.

Article entitled "Attaching Heat Sinks to Components," Electronic Packaging & Production, pp. 42–46, Jul. 1997.

Article entitled "Thermal Interface Materials," deSorgo et al., found at http://www.cooling-electronics.com/Resources/EC Articles/SEP96/sep96 01.htm (6 pp.).

Article entitled "Thermal Management Materials and Designs," *Electronic Packaging and Production*, Oct. 2000 (pp. 50–57).

Thermalloy Company Press Release (1 pg.), Dec. 18, 1996.

Article entitled "Cooling Technologies—Working With Microprocessors Points the Way to Thermal Management Improvements for Power Semiconductors," *PCIM*, May 1999 (6 pp.)

Article entitled "Test Methods for Characterizing the Thermal Transmission Properties of Phase-change Thermal Interface Materials," (http://www.electronics-cooling.com/html1/1999 may article1.html), May 1999 (9 pp.).

Brochure for Thermagon Company (5 pp), ©1997.

Brochure for Orcus, Inc., (3 pp.), ©1998.

Brochure for Bergquist Company (5 pp.), ©1998.

Advertisement for Bergquist Company "Thermal Performance you must see to believe," (1 pg.), undated.

Brochure for Power Devices Company (11 pp.), ©1996.

Brochure for Chomerics Company (6 pp.), Oct. 1999.

Advertisement for Chomerics Company's "Therm–A–Gap" Gap Filling Materials, (1 pg.), Oct. 1999.

Advertisement for "GAP PAD VO," (1 pg.), undated.

Advertisement for Fujipoly Company's "SARCON Thermal Management Components," (1 pg.), undated.

Advertisement for Fujipoly Company's "SARCON Heat Sink Gel Pads," (1 pg.), undated.

Abstract regarding WO 0036893, entitled, "Method of Applying a Phase–Change Thermal Interface Material" published Jun. 22, 2000 (1 pg.).

* cited by examiner

DRY THERMAL INTERFACE MATERIAL

CROSS-REFERENCE TO RELATED APPLICATIONS

This application is a continuation of allowed U.S. application Ser. No. 09/951,501, filed Sep. 14, 2001 now U.S. Pat. No. 6,610,635, and entitled DRY THERMAL INTERFACE MATERIAL, which is a continuation-in-part of U.S. application Ser. No. 09/661,729, filed Sep. 14, 2000, and entitled: "DRY THERMAL GREASE", now U.S. Pat. No. 6,475,962.

BACKGROUND OF THE INVENTION

1. Field of the Invention

This invention relates to thermal transfer materials and, more particularly, to a dry thermal interface material, and related methods of producing and applying the material between an electronic component and a heat sink.

2. Description of the Related Art

Electronic assemblies are usually fabricated with a plurality of electronic components attached to a substrate, such as a printer circuit board. In order for these assemblies to operate properly and reliably for extended periods of time, the heat generated by the components must be efficiently and reliably transferred from the component to the board, which acts as a heat sink.

Such electronic assemblies are operating at increasingly higher temperatures as they are built smaller and run faster. With smaller electronic components, the density can also be increased, which further increases the need for efficient and reliable removal of heat.

The ultimate theoretical thermal transfer occurs where a component and the heat sink interface in continuous contact. In reality, however, the respective surfaces of the component and heat sink have irregularities, such as microscopic voids or pores, which trap air. Since air is a poor conductor of heat, these irregularities/voids must be filled with some thermally conductive material, to effect more efficient thermal transfer. The following materials and techniques have been used to promote this thermal transfer.

Silicone-based thermal grease served as an early thermal interface material for electronic assemblies. Such grease is formed by dispersing thermally conductive ceramic fillers in silicone to form a sticky paste.

When the grease is applied between a surface of the electronic component and a surface of the heat sink, the grease fills the voids and eliminates the interstitial air. Any excess grease flows out at the edges of the component. The use of this grease allows for the thinnest possible joint as both mating surfaces come into contact at their high points, resulting in a very low thermal resistance.

Although such grease has proved to be a very good thermal conductor, problems are associated with its use. It is messy, due to its moist-to-the-touch, sticky state, and it is time-consuming to apply (e.g., generally the right amount of grease must be applied). Also, if the grease is applied to a protective sheet liner, to facilitate handling, shipping, etc., when the liner is removed prior to application of the grease to the electronic component surface, up to 50% of the grease may remain on the liner, causing waste, increasing costs, and resulting in a less effective thermal interface than desired. In addition, during operation of the electronics, when heat is being generated, the thermal grease migrates away from the area of application. Also, silicon-based greases exhibit the disadvantage of causing silicone contamination of a wave solder bath. If silicone oil migrates onto a printed circuit board, any solder re-work on the board will not adhere. Such migration may also cause short circuits on the board.

Non-silicone thermal grease was then developed to address many of the above-discussed problems associated with silicone-based products. Non-silicone greases are formed by dispersing the thermally conductive ceramic fillers in hydrocarbon oils.

While the non-silicone-based greases addressed the migration/contamination characteristics of silicone-based products, they still suffered from being messy, since they still exhibited moist/sticky characteristics, and they were still difficult and time-consuming to apply.

In a further effort to provide an acceptable replacement for thermal grease, relatively thicker and drier elastomeric thermal pads were developed. Their composition is basically silicone rubber-containing heat-conducting particles, such as zinc oxide, aluminum oxide, aluminum nitride, and boron nitride. The advantages of using these pads have included the facts that they are less messy (due to being drier), installation is easier and less time-consuming, and they eliminate the need to apply only the correct amount of grease with each application.

As noted above, however, the ultimate thermal interface is where two parts touch at as many points as possible, and only where microscopic voids appear, are they filled. Whereas the above-described grease flows easily into these voids, and is easily displaced to allow as much direct contact as possible between the component and the heat sink, these pads do not allow for any direct contact between the surfaces of the component and the heat sink. That is, these silicone elastomers deform to surface irregularities only when a significant compressive load is applied, which may be detrimental to the electronic component. At low pressure, the pad simply cannot fill the air voids between the surfaces, causing a relatively very high thermal resistance.

Wax or paraffin-based phase-change materials have also been developed, which exhibit grease-like thermal performance and, due to their relative dryness, exhibit easier elastomeric pad-like handling and installation. These phase-change materials have been used in a stand-alone form, have been reinforced with fiberglass, or have been coated onto foil or Kapton®. Kapton is a thermally conductive but electrically insulative polymide film available from the DuPont company. These phase-change materials are solid at room temperature, but they behave much like thermal pastes or greases once they reach their phase-change, or melt operational temperature, i.e., usually between 40° C. and 70° C.

Since these phase-change materials are solid and dry at room temperature, they are not messy to apply. As they are heated they become liquid and flow into the pores. However, in a vertical orientation of the electronic component, they will flow out of the interface, again leaving voids. These materials require pressure sensitive adhesives to adhere to parts during assembly, which adhesives undesirably increase thermal resistance. The operational high temperature range for phase-change materials is only 150° C., however, versus 200° C. for thermal grease. Further, in a "cold plate" application, i.e., using water and/or thermoelectric modules to help cool electronic assemblies, the temperature would not reach the melt operational temperature, so the phase-change material would not receive enough heat to melt into place (wet the surface), and therefore would not be useable, whereas grease works at such temperature. Further, each thermal cycle and subsequent phase-change may introduce new air voids that may not be refilled.

In light of the above, thermal pads are easy to use, but exhibit a relatively high thermal resistance. And, while phase-change materials may outperform pads in terms of thermal transfer efficiency, they still bear limitations in use and performance. Thermal grease offers superior performance to these grease replacements, including most particularly the lowest thermal resistance, but can be very messy and labor-intensive during application.

Although the prior art described above eliminates some of the problems inherent in the thermal transfer art, this prior art still does not disclose or teach the most efficient compound and related methods of production and use.

SUMMARY OF THE INVENTION

Accordingly, it is a purpose of the present invention to provide a thermal interface material that exhibits the positive attributes of conventional thermal greases, but it easier to apply.

It is another purpose of the present invention to provide a dry thermal interface material that allows for total wetting action to fill any voids between an electronic component and a heat sink, without the need to change the phase of the material.

It is another purpose of the present invention to provide a thermal interface material having a positive coefficient of thermal expansion and thixotropic properties to improve wetting action, thereby facilitating total thermal interface contact between an electronic component and a heat sink.

It is yet another purpose of the present invention to provide a thermal transfer material that allows immediate heat transfer at any operational temperature, without the need for a phase-change, making the material particularly appropriate for cold plate applications.

It is further a purpose of the present invention to provide a thermal transfer material that offers the advantages and conveniences of thermal pads and phase-change materials, but has the superior performance of thermal grease.

It is still another purpose of the present invention to provide a thermal grease which facilitates handling and prevents migration.

It is but another purpose of the present invention to provide a non-silicone- and nonwaxed-based thermal grease or paste that may be naturally tacky.

It is another purpose of the present invention to provide a thermal transfer compound which can be molded into sheets, blocks and other forms, and then cut, to facilitate placement between an electrical component and a heat sink.

It is also a purpose of the present invention to provide a drop-in-place thermal transfer compound that is easy to use and handle in many manufacturing environments.

It is also a purpose of the present invention to provide a thermal transfer compound which can be applied with minimal pressure.

It is still another purpose of the present invention to provide a dry but naturally tacky thermal transfer material that does not require any adhesive or other additives which might reduce thermal transfer efficiency.

It is also a purpose of the present invention to provide a thermal transfer compound that is thixotropic in nature to prevent run out from between an electronic component and a heat sink during operation of the component.

It is another purpose of the present invention to provide a method for forming a relatively dry thermal transfer compound, but with some tackiness.

It is also a purpose of the present invention to provide a thermal transfer material that exhibits both superior thermal transference and electrical insulative properties.

It is another purpose of the present invention to provide a method for more effectively applying a thermal transfer material between an electronic component and a heat sink.

It is also a purpose of the present invention to provide a method for applying a thermal transfer material using only a minimal amount of force to effect total interface contact between an electronic component and a heat sink.

To achieve the foregoing and other purposes of the present invention there is provided a thermal transfer material including a compound that has high thermal conductivity, is relatively dry-to-the-touch, is naturally tacky, and may be formed into various shapes, such as blocks, sheets, etc., to facilitate its application between an electronic component and a heat sink. The compound includes a pre-blend made up of a polyol ester, and an antioxidant, as well as a filler(s), a high viscosity oil, and either a polystyrene-based polymer, a solvent, and a surfactant, or aluminum silicate.

The present invention is also directed to providing a method for producing the compound including the steps of mixing polyol ester in an amount of about 99 wt. percent and an antioxidant in an amount of about 1 wt. percent to form the pre-blend (which pre-blend makes up about 8–12 wt. percent of the compound), adding at least one of a zinc oxide filler in the amount of about 18–80 wt. percent and a magnesium oxide filler in the amount of about 60 wt. percent to the pre-blend; and adding a high viscosity oil in the amount of about 2.5–5.5 wt. percent. Further, in one embodiment there is added a surfactant in the amount of about 0.2 wt. percent, a polystyrene-based polymer in the amount of about 3 wt. percent, and a solvent in the amount of about 1 wt. percent. In an alternate embodiment, instead of the polymer, solvent and surfactant, there is added aluminum silicate in an amount of about 5.2 wt. percent of the compound.

This dry-to-the-touch thermal transfer material offers very low thermal resistance at lower closure pressure, like conventional thermal grease, but offers the handling ease of the conventional grease replacements discussed above, thereby eliminating the need to sacrifice thermal performance for convenience. The block, sheet, etc. forms of the material can be die-cut and possess a natural tackiness that allows them to adhere to an electronic component or heat sink without using additional adhesives that would degrade thermal performance. The material also exhibits a positive coefficient of thermal expansion and exhibits thixotropic properties which allow it to wet surfaces, further improving interface contact. And, because heat transfer begins immediately and can take place at any temperature, it is excellent for cold plate applications. The material is also silicone free to avoid problems of silicone contamination, and can be electrically insulating, if desired.

The present invention is also directed to a method for providing a thermal interface material for electronic component assemblies, including the following steps: providing a heat generating electronic component with a first mounting surface; providing a second mounting surface on a heat sink upon which the first mounting surface of the heat generating electronic component is to be mounted; and disposing the dry thermal transfer material discussed above between the first mounting surface and the second mounting surface to effect heat transfer from the electronic component to the heat sink.

Further, the material can include a thermally conductive foil backing, or a thermally conductive and electrically insulative backing, and be die cut, if desired. Also, removable liners can be applied to exposed surfaces of the compound to facilitate handling, shipping and storage, but same are removed prior to the material being applied between the electronic component and the heat sink.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

The present invention is a non-silicone, non-wax-based, dry-to-the-touch thermal grease or paste compound that is naturally tacky, and can be used as a very efficient thermal transfer material, such as between an electronic component and a heat sink.

This compound is based on a pre-blend made up of about 98.8% by weight of polyol ester, such as HATCOL 2373, and about 1.2% by weight of an antioxidant, such as ETHANOX 330. To this pre-blend are added at least a filler(s), an oil, a polymer, a surfactant and a solvent, or a filler(s), the oil, and aluminum silicate, as described below, depending upon the intended use for the composition.

According to a first embodiment, exemplary components and weight percentages are set forth in the following Table 1:

TABLE 1

| Components | Percentage by Weight of Compound |
| --- | --- |
| Pre-Blend | 8.1 to 9.9 |
| Zinc Oxide | 65.52 to 80.08 |
| High Viscosity Oil | 4.5 to 5.5 |
| Polymer | 2.7 to 3.3 |
| Solvent | .9 to 1.1 |
| Surfactant | .198 to .202 |

The zinc oxide is a powder that serves as the filler material. As fillers, any thermally conductive filler known in the art should be suitable, including other metal oxides, silver, aluminum nitride and boron nitride. Magnesium oxide would generally not be used as a filler with this embodiment because of its relatively large particle size.

The oil is preferably polyisobutene, which is generally known as a viscosity index improver. One commercially available oil is called Indopol.

This embodiment of the compound is made thixotropic and relatively dry-to-the touch by incorporating an appropriate polymer. The polymer is preferably polystyrene-based. The thixotropic characteristic provides complete wetting across the interface, and keeps the material from flowing out of the interface, even in a vertically-oriented application. The dryness significantly facilitates handling and use.

Exemplary solvents are naphtha, hexane, heptane, and other quick-dissipating petroleum distillates.

An exemplary surfactant is polyglycolether, sold commercially as Genapol. The surfactant facilitates the formation of the grease compound into a thin film. The surfactant is not needed, however, in the composition for the second "block" embodiment described below, which is more dense.

This compound performs as well as, or better than conventional thermal grease, as shown in Table 2 below, which compares the typical properties of conventional thermal grease with the dry-to-the-touch compound of the present invention:

TABLE 2

| Typical Properties | Standard Grease | Invention Compound | Test Method |
| --- | --- | --- | --- |
| Consistency/Penetration | 320 | 190 | ASTM-D217 |
| Evaporation loss 200° C., %/wt | 0.5 | 0.1 | FTM-321 |
| Thermal Conductivity, W/m ° K | 0.70 | 1.0 | ASTM D-5470 modified |
| Thermal Resistance, ° C. in$^2$/W | 0.05 | 0.03 | ASTM D-5470 modified |
| Volume Resistivity, ohm-cm | $1.65 \times 1014$ | $2.0 \times 101"$ | ASTM D-257 |

The compound according to the present invention is, like phase-change and elastomeric pad materials, dry-to-the-touch, but does not otherwise suffer from the above-discussed drawbacks of these materials. On the other hand, the compound according to the present invention does not exhibit the messiness of conventional thermal grease, but enjoys its very low thermal resistance.

The compound exhibits a positive coefficient of expansion, resulting in swelling of the compound to wet the surface, helping to fill the voids even better than conventional grease. The positive coefficient of expansion occurs on the microscopic level, so there is no physical change in the compound.

The compound can be applied directly to an electronic component or to a substrate, prior to the electronic component being applied to the substrate.

This compound can also be combined with, e.g., a propellant and applied by spraying directly onto the electronic component or substrate in the desired thickness, as would be known in the art. The compound of this first embodiment can also be screen printed directly onto the electronic component or substrate. In either case, the compound will become dry-to-the-touch within a few seconds of application due to the evaporation of the solvent.

Alternatively, the compound can be layered on a first protective liner. Then a second protective liner can be placed over the still exposed surface of the compound, opposite the first protective liner to form a laminate. These liners should be made of a material that has a high release value that doesn't disturb the compound film. A preferred material is polypropylene. The liners simply function to protect the film until the film is applied. The laminate can be cut to size depending upon the size of the base of the electronic component.

In order to apply the compound, the first liner is removed from the laminate. The surface of the compound that is thereby exposed is then placed against the base surface of the electronic component with "rolling finger pressure". Then the second liner is removed from the compound which remains adhered to the base of the electronic component. That is, the compound will adhere, due to its natural tackiness, to the component or heat sink without adhesive or any other "non-thermally conductive" material that would degrade thermal performance. The electronic component is then placed on the substrate with pressure of about 5 PSI or more to achieve total interface contact.

As can be seen, application of the thermal transfer compound of the present application is possible with only minimal pressure. In this way, there is less likelihood of damage to the sensitive electronic components.

Alternatively, after the first liner is removed, and the compound is adhered to the component or heat sink, the second, exposed liner can remain on to protect the material, i.e., the components can be pre-coated for easy and protected transportation, storage and later assembly.

The material can be cold applied and requires no heating or curing thereafter. The material can be removed easily and cleanly, if necessary, without special tools for easy access and rework.

Alternatively, the compound may be applied as a thin layer on a heat conductive sheet backing to produce a thermal transfer material that can be cut to fit a variety of different shapes of the electrical components.

For example, the compound of the first embodiment of the present invention can be coated onto an aluminum foil substrate referred to herein as "A" to provide exceptional thermal conductivity, or coated onto Kapton®, "K", for both electrical insulation and thermal conductivity, as described in detail below. Among the advantages are again its ease of use (as with thermal pads and phase-change materials), as well as the superior performance of thermal grease.

In the former regard, the dry compound is pre-applied to both sides of a foil substrate A in a thickness varying preferably from 1 mil to 4 mil. For example, a 2 mil foil could have 1 or 2 mil of film applied to each opposing surface, as shown in Table 3 below. Of course, a thinner/thicker substrate, and/or a thinner/thicker layer of the compound can be applied thereto, as desired.

TABLE 3

| Substrate Type | Aluminum(Ex.1) | Aluminum(Ex.2) |
|---|---|---|
| Physical Properties | | |
| Substrate Thickness, in. | 0.002 | 0.002 |
| Compound Thickness (per side), in. | 0.001 | 0.002 |
| Total Thickness, in. | 0.004 | 0.006 |

TABLE 3-continued

| Substrate Type | Aluminum(Ex.1) | Aluminum(Ex.2) |
|---|---|---|
| Thermal Properties | | |
| Thermal Resistance, ° C. in$^2$/W (ASTM D-5470 modified) | 0.018 | 0.02 |

This embodiment is an easy-to-use, non-paraffinic thermal interface film with the superior performance of conventional thermal grease. Unlike phase-change materials, this film can be used at 25° C. or lower, making the compound well-suited for cold plate applications. Further, the compound requires only minimal force to achieve total surface wetting, and interface contact. As seen, the film exhibits an exceptionally low thermal resistance; as low as about 0.02 (C° in$^2$/W).

The foil A with the compound thereon can be cut into any desired size and shape to adapt to the interface surface of the electronic component, and be attached thereto. These cut thermal interface materials can also be applied to a roll of sheet-like material for shipping/storing, prior to application on the electronic component.

Similarly, the compound can be applied to the substrate K, which exhibits not only thermal transfer capabilities, but also electric insulative properties, as illustrated in Table 4:

TABLE 4

| | Value | Test Method |
|---|---|---|
| Physical Properties | | |
| Substrate type | Kapton ® | |
| Substrate Thickness, in. | 0.002 | |
| Compound Thickness/(per side) in. | 0.002 | |
| Total Thickness, in. | 0.006 | |
| Thermal & Electrical Properties | | |
| Thermal Resistance, ° C. in$^2$/W | 0.028–0.03 | ASTM D-5470 (modified) |
| Dielectric Strength, V/mil (VAC) | 2000 (12000) | ASTM D-149 |
| Dielectric Constant, @ 1 KHz | 3.7 | ASTM D-150 |
| Volume Resistivity, ohm-cm | $1.01 \times 10^{15}$ | ASTM D-257 |

This thermal interface material is thus a die-cut polymide, electrically insulating substrate K coated on both sides with the dry thermal interface compound. This material offers high heat transfer and high electrical insulating capabilities, and has a high cut-through resistance, as shown in Table 5, which compares the typical properties of the thermal interface materials A and K according to the present invention:

TABLE 5

| | A | K | Test Method |
|---|---|---|---|
| Physical Properties | | | |
| Substrate | Aluminum | Kapton ® | |
| Substrate Thickness, in. | 0.002 | 0.002 | |
| Compound Thickness/Side, in. | 0.002 | 0.002 | |
| Total Thickness, in. | 0.006 | 0.006 | |
| Thermal & Electrical Properties | | | |
| Thermal Conductivity, W/m ° K | 2.5 | 0.77 | ASTM D-5470 modified |
| Thermal Resistance, ° C. in$^2$/W | 0.02 | 0.028–0.03 | ASTM D-5470 modified |

TABLE 5-continued

|  | A | K | Test Method |
|---|---|---|---|
| Dielectric Strength, V/mil VAC | N/A | 2000 (12,000) | ASTM D-149 |
| Volume Resistivity, ohm-cm | N/A | $1.01 \times 10^{15}$ | ASTM D-257 |

As can be seen from the following Table 6, the present invention in either the foil version A or the Kapton version K exhibits exceptional thermal resistance at relatively low pressure, when compared with the conventional interface materials discussed above (using ASTM D-5470-modified):

TABLE 6

THERMAL RESISTANCE

|  | A | K | Silicone Pad | Kapton Reinforced Phase Change Pad | Fiberglass Reinforced Phase Change Pad | Aluminum Foil Reinforced Graphite Pad | Graphite Pad |
|---|---|---|---|---|---|---|---|
| 10 psi | 0.023 | 0.029 | 0.094 | 0.054 | 0.057 | 0.03 | 0.029 |
| 30 psi | 0.019 | 0.027 | 0.068 | 0.047 | 0.055 | 0.02 | 0.02 |
| 50 psi | 0.005 | 0.026 | 0.059 | 0.037 | 0.054 | 0.011 | 0.017 |
| 70 psi | 0.002 | 0.024 | 0.052 | 0.034 | 0.05 | 0.007 | 0.016 |

Further, like the foil embodiment A described above, protective liners can be used, the entire thermal interface material combination can be applied between an electronic component and the heat sink with a pressure of about 5 PSI or more, and sheets of this embodiment K can be placed on rolls for shipment and storage, prior to application.

Compared to the use of the compound-only applied directly to the component/heat sink, as described above, the thermal conductivity of the foil A or Kapton K embodiments is slightly less, due to the additional use of the foil and Kapton sheets.

In addition to the foil or Kapton substrates noted above, other substrates or carriers can be used, e.g., a fiberglass mesh.

According to still another embodiment of the compound, blocks, sheets, and other shapes can be molded to fill larger gaps between an electronic component and a heat sink, much like the conventional elastomeric pads described above. That is, as surface textures of an electronic component and a heat sink and/or distances therebetween can be uneven, these blocks can be shaped to fit any desired gap or shape between a component and heat sink. Preferably the shape would be a flat, smooth, rectangular or circular sheet, etc., as known in the art. As with the embodiment described above, this embodiment is dry-to-the-touch.

For this embodiment of the compound, referred to herein as the block embodiment, the exemplary components and weight percentages are set forth in the following Table 7.

TABLE 7

| Components | P rcentages by Weight of Compound |
|---|---|
| Pre-Blend | 10.08 to 12.32 |
| Zinc Oxide Powder | 18.09 to 22.11 |
| Magnesium Oxide Powder | 54.81 to 66.99 |
| Aluminum Silicate | 4.68 to 5.72 |
| High Viscosity Oil | 2.25 to 2.75 |

The pre-blend and the oil are as described above.

The zinc oxide and the magnesium oxide are powders that serve as filler materials. Again, other known fillers can be used, as described above.

The aluminum silicate is a claylike material used to thicken the compound relative to the above-described embodiment, so that it can be formed into these shapes. Thus, the chemistry for the second embodiment is generally similar to that of the first embodiment, except that the second is dryer, and more clay like due to the addition of the aluminum silicate.

With this block embodiment, the compound can be formed with a thickness generally much greater than those associated with the above-described embodiments A and K. For example, the blocks could be 80 to 200 mils thick.

This block embodiment is highly conformable and naturally tacky, which provides an excellent replacement for the less conformable, conventional silicone elastomer gap fillers which require significant pressure to achieve 100 percent surface contact. As described above, such high pressure could damage the electronic component. The block embodiment of the present invention fills the gap and displaces the air with much less pressure being exerted on the electronic component.

The block embodiment's highly conformable nature allows the pad to fill all voids between a heat generating device and heat sink. The non-silicone formula thereof is particularly advantageous for optical applications and high compression loads. The material also conducts heat away from individual components and into metal covers, frames or spreader plates. This embodiment also offers unique advantages in applications such as microprocessors, cache chips, heat pipe interposer plates, laptop PCs, high-density handheld portable electronics, electronic ballasts and various automotive applications.

The typical properties of the block embodiment are set out in the following Table 8:

TABLE 8

| Physical Properties | Value | Test Method |
|---|---|---|
| Composition | Non-Silicone |  |
| Color | Gray |  |
| Density | 2.8 | ASTM D-70 |
| Thickness, in. (mm) | 0.08 (2 mm) & up |  |
| Operating Temperature Range | −40° C. to 150° C. |  |
| Thermal Conductivity, W/m ° K | 1.68 | ASTM D-5470 (modified) |

TABLE 8-continued

| Physical Properties | Value | Test Method |
|---|---|---|
| Thermal Resistance, ° C. in$^2$/w/mil | 0.03 | |
| Coefficient of Thermal Expansion | 31.8 × 10$^{-6}$/° C. | |
| Dielectric Strength, V/mil | 318 | ASTM D-149 |
| Volume Resistivity, ohm-cm | 2.15 × 10$^{15}$ | ASTM D-257 |

Unlike with the foil/Kapton embodiment described above, there is no backing attached to the block embodiment. Nevertheless, polypropylene liners can again be used, if desired.

The blocks, sheets, etc., that are formed can be die-cut to exact specifications from about 0.08" (2 mm) and higher.

This block embodiment will conform to any shape and/or size of a component enabling complete physical contact so as to minimize the resistance to heat flow and to achieve the best thermally conductive path.

Unlike phase-change materials, not only does this embodiment require only minimum pressure, heat transfer starts at 25° C., and total wetting action can again be attained via a positive coefficient of thermal expansion, without the need to change phase.

In comparison with the relatively thin interface material embodiments A and K described above, and the relatively thick blocks or sheets embodiment described above, the present invention can, if desired, be formed in thicknesses therebetween. For example, thicker substrates or carriers, such as a fiberglass mesh, as well as thicker layers of the compound of the present invention can be used.

Further, in contrast to the use of an electrically insulative material like Kapton, it may be desirable to have not only thermal conductivity but also electrical conductivity. An example of such a structure would be a copper foil with a silver layer thereon.

Specific suggested applications for the thermal interface material according to the above-described embodiments of the present invention include: power modules, IGBTs, DC-DC converter modules, solid state relays, diodes, power MOSFETs, RF components and thermoelectric modules; microprocessors, multichip modules, ASICs and other digital components; power amplifiers, large area applications for power supplies and other custom enclosure heat dissipating surfaces.

As can also be seen from the above description, the present invention exhibits at least the following advantages over the prior art: a) retains all of the proven values of conventional thermal grease; b) requires only minimum force for total interface contact between an electrical component and a heat sink; c) allows for total "wetting action" to fill voids between an electrical component and a heat sink without changing phase; d) exhibits a positive coefficient of thermal expansion and thixotropic properties to increase the wetting action for even greater interface contact; e) allows heat transfer immediately and therefore can be used at any operational temperature, unlike conventional phase-change materials, making the material an excellent selection for cold plate applications; f) provides essentially a "drop-in place" product that is easy to use and handle in any manufacturing environment; g) provides a non-messy, dry-to-the-touch, naturally tacky material using no separate adhesive, or other non-conductive material (e.g., fiberglass) that may affect thermal resistance; h) microscopically changes to fill voids on electronic part surfaces; i) prevents run-out due to its thixotropic nature; j) can exhibit both heat transfer properties and high electrical insulating capabilities; and k) will not lose its viscosity and become runny after application, under continuous heat or pressure conditions, or if applied to a vertical surface.

The foregoing is considered illustrative only of the principles of the invention. Further, since numerous modifications and changes will readily occur to those skilled in the art, it is not desired to limit the invention to the exact construction and operation shown and described. Accordingly, all suitable modifications and equivalents may be resorted to that fall within the scope of the invention and the appended claims.

What is claimed is:

1. A thermal transfer compound, comprising:
   a polyol ester, an antioxidant, a boron nitride filler, a high viscosity oil, a surfactant, a polystyrene-based polymer and a solvent.

2. The compound as recited in claim 1, wherein the polyol ester and the antioxidant form a pre-blend with the polyol ester making up about 99 wt. percent of the pre-blend, and the antioxidant making up about 1 wt. percent of the pre-blend.

3. The compound as recited in claim 2, wherein the pre-blend is in the amount of about 8 to 12 wt. percent of the compound.

4. A thermal transfer compound, comprising:
   a polyol ester, an antioxidant, a boron nitride filler, a high viscosity oil and aluminum silicate.

5. The compound as recited in claim 4, wherein the polyol ester and the antioxidant form a pre-blend with the polyol ester making up about 99 wt. percent of the pre-blend, and the antioxidant making up about 1 wt. percent of the pre-blend.

6. The compound as recited in claim 5, wherein the pre-blend is in the amount of about 10 to 12 wt. percent of the compound.

7. A thermal interface material, comprising:
   a thermally conductive compound made of a polyol ester, an antioxidant, a boron nitride filler, a high viscosity oil, a surfactant, a polystyrene-based polymer and a solvent, and a sheet receiving, on at least one surface thereof, the compound.

8. The material as recited in claim 7, wherein the sheet is polypropylene.

9. A method for providing a thermal interface material for electronic component assemblies, comprising the following steps:
   a) providing a heat generating electronic component with a first surface;
   b) providing a substrate with a second surface with which the first surface is to interface;
   c) disposing the compound produced according to claim 1 on a first surface of a sheet;
   d) placing the first surface of the sheet on the first surface of the heat generating electronic component with the compound therebetween;
   e) removing the sheet; and
   f) placing the second surface of the substrate on the first surface of the heat generating electronic component with the compound therebetween to effectuate heat transfer between the component and the substrate.

10. The method as recited in claim 9, wherein the compound is disposed by the following steps:
   g) placing a relatively thin layer of the compound onto the first surface of the sheet;

h) cutting the sheet into a shape corresponding to a shape of the first surface of the heat generating electronic component; and i) placing the cut sheet on the first surface of the heat generating electronic component with the compound therebetween.

11. A method for providing a thermal interface material for electronic component assemblies, comprising the following steps:

a) providing a heat generating electronic component with a first surface;

b) providing a substrate with a second surface with which the first surface is to interface;

c) disposing the compound produced according to claim 4 on a first surface of a sheet;

d) placing the first surface of the sheet on the first surface of the heat generating electronic component with the compound therebetween;

e) removing the sheet; and f) placing the second surface of the substrate on the first surface of the heat generating electronic component with the compound therebetween to effectuate heat transfer between the component and the substrate.

12. The method as recited in claim 11, wherein the compound is disposed by the following steps:

g) forming a block of the compound to fit a shape of a gap between the first surface of the component and the second surface of the substrate;

h) placing a surface of the block on a sheet;

i) placing the block and sheet in the gap between the first surface of the component and the second surface;

j) removing the sheet; and k) applying pressure to at least one of the component and substrate.

13. A non-water soluble thermal transfer compound, comprising:

a polyol ester, an antioxidant, a boron nitride filler, a high viscosity oil, a surfactant, a polystyrene-based polymer and a solvent.

14. A non-water soluble thermal transfer compound, comprising:

a polyol ester, an antioxidant, a boron nitride filler, a high viscosity oil and aluminum silicate.

15. A non-water soluble thermal interface material, comprising:

a thermally conductive compound made of a polyol ester, an antioxidant, a boron nitride filler, a high viscosity oil, a surfactant, a polystyrene-based polymer and a solvent, and a sheet receiving, on at least one surface thereof, the compound.

16. A method for forming a thermal interface material, comprising the steps of:

forming a thermally conductive compound from a polyol ester, an antioxidant, a boron nitride filler, a high viscosity oil, a surfactant, a polystyrene-based polymer and a solvent;

coating a sheet, on at least one surface thereof, with the compound; and removing the sheet.

17. A method for forming a thermal interface material, comprising the steps of:

forming a thermally conductive compound from a polyol ester, an antioxidant, a boron nitride filler, a high viscosity oil, a surfactant, a polystyrene-based polymer and a solvent;

coating a sheet, on a surface thereof, with the compound to form a film;

allowing at least part of the solvent to evaporate;

placing the sheet on a heat generating device with the compound therebetween;

removing the sheet; and placing a heat sink on the compound.

18. A method for providing a thermal interface material on a heat generating component, comprising the following steps:

a) providing the heat generating component with a first surface;

b) providing a second surface on a heat dissipating component upon which the first surface of the heat generating component is to be mounted; and c) disposing a thermal interface material including a polyol ester and boron nitride between the first and second surfaces to effectuate heat transfer from the heat generating component to the heat dissipating component.

19. The method of claim 18, whereby the disposing step is by the following steps:

d) shaping a block of the material to fit a shape of a gap between the first and second surfaces; and e) placing the block in the gap between the first and second surfaces.

20. The method of claim 18, whereby the disposing step is by the following steps:

d) disposing a relatively thin layer of the material onto a sheet;

e) attaching the material and sheet to said one of the first and second surfaces; and f) removing the sheet.

* * * * *